United States Patent
Ji et al.

(10) Patent No.: US 11,769,633 B2
(45) Date of Patent: Sep. 26, 2023

(54) BOARD HAVING MULTILAYER CAPACITOR MOUNTED THEREON AND MULTILAYER CAPACITOR PACKAGE

(71) Applicant: SAMSUNG ELECTRO-MECHANICS CO., LTD., Suwon-si (KR)

(72) Inventors: Gu Won Ji, Suwon-si (KR); Heung Kil Park, Suwon-si (KR); Sang Soo Park, Suwon-si (KR); Young Ghyu Ahn, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 51 days.

(21) Appl. No.: 17/349,275

(22) Filed: Jun. 16, 2021

(65) Prior Publication Data
US 2021/0313115 A1    Oct. 7, 2021

Related U.S. Application Data

(62) Division of application No. 16/990,288, filed on Aug. 11, 2020, now abandoned.

(30) Foreign Application Priority Data

Sep. 20, 2019  (KR) .................. 10-2019-0116376
Aug. 7, 2020   (KR) .................. 10-2020-0099136

(51) Int. Cl.
*H01G 4/008*   (2006.01)
*H01G 4/012*   (2006.01)
(Continued)

(52) U.S. Cl.
CPC .............. *H01G 4/30* (2013.01); *H01G 4/008* (2013.01); *H01G 4/012* (2013.01); *H01G 4/12* (2013.01);
(Continued)

(58) Field of Classification Search
CPC .......... H01G 2/06; H01G 4/008; H01G 4/012; H01G 4/12; H01G 4/228; H01G 4/232;
(Continued)

(56) References Cited

U.S. PATENT DOCUMENTS

2013/0319741 A1   12/2013   Ahn et al.
2013/0321981 A1   12/2013   Ahn et al.
(Continued)

FOREIGN PATENT DOCUMENTS

CN    103456495 A    12/2013
CN    104979096 A    10/2015
(Continued)

OTHER PUBLICATIONS

Chinese Office Action dated Nov. 1, 2021, issued in corresponding Chinese Patent Application No. 202010953068.7.
(Continued)

*Primary Examiner* — Timothy J Thompson
*Assistant Examiner* — Guillermo J Egoavil
(74) *Attorney, Agent, or Firm* — Morgan, Lewis & Bockius LLP (57) ABSTRACT

An electronic component includes a board having first and second electrode pads on one surface of the board; and a multilayer capacitor. The multilayer capacitor comprises: a capacitor body comprising a dielectric layer and a plurality of internal electrodes, disposed horizontally with respect to a mounting surface of the capacitor body facing the one surface of the board, and external electrodes disposed on both end portions of the capacitor body and connected to exposed portions of the internal electrodes, respectively. The electronic component satisfies $Lp/Lc \leq 1.35$, where a distance between outer edges of the first and second electrode pads is defined as Lp, and a length of the multilayer capacitor is defined as Lc.

1 Claim, 13 Drawing Sheets

(51) Int. Cl.
*H01G 4/12* (2006.01)
*H01G 4/228* (2006.01)
*H01G 4/30* (2006.01)
*H05K 1/11* (2006.01)
*H05K 1/18* (2006.01)

(52) U.S. Cl.
CPC ............. *H01G 4/228* (2013.01); *H05K 1/111* (2013.01); *H05K 1/181* (2013.01); *H05K 2201/10015* (2013.01)

(58) Field of Classification Search
CPC ........ H01G 4/2325; H01G 4/30; H01G 4/248; H05K 1/111; H05K 1/181; H05K 1/11; H05K 1/18; H05K 3/3405; H05K 3/3442; H05K 2201/10015; H05K 2201/09227; H05K 2201/10522; H05K 2201/2045; Y02P 70/50; Y10T 29/4913
USPC ...... 174/260; 361/321.2, 301.4, 321.5, 321.4
See application file for complete search history.

(56) References Cited

U.S. PATENT DOCUMENTS

| 2014/0110161 A1* | 4/2014 | Hattori | H05K 3/3415 29/832 |
|---|---|---|---|
| 2014/0133064 A1 | 5/2014 | Ahn et al. | |
| 2014/0182101 A1* | 7/2014 | Sasaoka | G01R 33/12 29/25.41 |
| 2014/0332261 A1* | 11/2014 | Fujimoto | H01G 4/248 29/832 |
| 2015/0223334 A1 | 8/2015 | Nakagawa | |

FOREIGN PATENT DOCUMENTS

| DE | 202012013365 U1 * | 9/2016 | ............... G09F 2/02 |
|---|---|---|---|
| JP | H-02209000 A * | 8/1990 | ............... B23P 21/00 |
| JP | H06235699 A * | 8/1994 | ............... H05K 13/08 |
| JP | H07-329915 A | 12/1995 | |
| JP | 2013-251551 A | 12/2013 | |
| JP | 2014-239207 A | 12/2014 | |
| JP | 6232728 B2 | 11/2017 | |

OTHER PUBLICATIONS

Office Action is corresponding U.S. Appl. No. 16/990,288 dated Jun. 25, 2021.

Office Action issued in corresponding Japanese Patent Application No. 2020-136814 dated Sep. 7, 2021, with English translation.

* cited by examiner

BOARD HAVING MULTILAYER CAPACITOR MOUNTED THEREON AND MULTILAYER CAPACITOR PACKAGE

CROSS-REFERENCE TO RELATED APPLICATION(S)

This application is the divisional application of U.S. patent application Ser. No. 16/990,288 filed on Aug. 11, 2020, which claims benefit of priorities to Korean Patent Application No. 10-2019-0116376 filed on Sep. 20, 2019 and Korean Patent Application No. 10-2020-0099136 filed on Aug. 7, 2020 in the Korean Intellectual Property Office, the disclosures of which are incorporated herein by reference in its entirety.

TECHNICAL FIELD

The present disclosure relates to a board having a multilayer capacitor mounted thereon.

BACKGROUND

A multilayer electronic component such as a multilayer capacitor is formed of a dielectric material. As the dielectric material has piezoelectricity, the dielectric material may be synchronized with an applied voltage and may be deformed.

When a period of the applied voltage is within an audio frequency band, displacement of the voltage may turn into vibrations, the vibrations may be transmitted to a board through a solder, and vibrations of the board may be perceived as audible sound. Such audible sound is referred to as acoustic noise.

When a device operates in a quiet environment, a user may perceive the acoustic noise as abnormal noise, and may believe that the device has malfunctioned.

Also, the acoustic noise may overlap a voice output in a device having a voice circuit, and quality of the device may degrade.

Besides the audible acoustic noise, when piezoelectric vibrations of the multilayer capacitor occur in a high radio frequency range of 20 kHz or higher, piezoelectric vibrations may cause malfunctions of sensors used in the IT and automotive industries.

SUMMARY

An aspect of the present disclosure is to provide a mounting board of a multilayer capacitor, prepared by checking the numerical value in which acoustic noise is reversed according to a direction in which internal electrodes are stacked on amounting surface in the multilayer capacitor, and selectively mounting the multilayer capacitor on a board in a direction parallel to or perpendicular to the board on the basis of the checked numerical value, to optimize effects of reducing acoustic noise in the audible frequency region lower than 20 kHz and high frequency vibrations of 20 kHz or higher.

According to an aspect of the present disclosure, an electronic component includes a board having first and second electrode pads on one surface of the board; and a multilayer capacitor. The multilayer capacitor comprises: a capacitor body comprising a dielectric layer and a plurality of internal electrodes, disposed horizontally with respect to a mounting surface of the capacitor body facing the one surface of the board; and external electrodes disposed on both end portions of the capacitor body and connected to exposed portions of the internal electrodes, respectively. The electronic component satisfies $Lp/Lc \leq 1.35$, where a distance between outer edges of the first and second electrode pads is defined as $Lp$, and a length of the multilayer capacitor is defined as $Lc$.

According to another aspect of the present disclosure, an electronic component includes a board having first and second electrode pads on one surface of the board; and a multilayer capacitor. The multilayer capacitor comprises: a capacitor body comprising a dielectric layer and a plurality of internal electrodes, disposed vertically with respect to a mounting surface of the capacitor body facing the one surface of the board; and external electrodes disposed on both end portions of the capacitor body and connected to exposed portions of the internal electrodes, respectively. The electronic component satisfies $Lp/Lc > 1.35$, where a distance between outer edges of the first and second electrode pads is defined as $Lp$, and a length of the multilayer capacitor is defined as $Lc$.

According to another aspect of the present disclosure, an electronic component includes a board having first and second electrode pads on one surface of the board; and a multilayer capacitor. The multilayer capacitor comprises: a capacitor body comprising a dielectric layer and a plurality of internal electrodes stacked with the dielectric layer interposed therebetween; and external electrodes disposed on both end portions of the capacitor body and connected to exposed portions of the internal electrodes, respectively. When the electronic component satisfies $Lp/Lc \leq 1.35$, where a distance between outer edges of the first and second electrode pads is defined as $Lp$, and a length of the multilayer capacitor is defined as $Lc$, the dielectric layer and the internal electrodes are disposed horizontally with respect to the board, and when the electronic component satisfies $Lp/Lc > 1.35$, the dielectric layer and the internal electrodes are disposed vertically with respect to the board.

According to another aspect of the present disclosure, a multilayer capacitor package includes a packing part containing information, and including a housing and a multilayer capacitor disposed in the housing, internal electrodes of the multilayer capacitor disposed horizontally with respect to a bottom surface of the housing. The information indicates a distance $Lp$ between outer edges of pads on a board, on which the multilayer capacitor is to be mounted, and $Lp/Lc \leq 1.35$, in which $Lc$ is a length of the multilayer capacitor.

According to another aspect of the present disclosure, a multilayer capacitor package includes a packing part containing information, and including a housing and a multilayer capacitor disposed in the housing, internal electrodes of the multilayer capacitor disposed vertically with respect to a bottom surface of the housing. The information indicates a distance $Lp$ between outer edges of pads on a board, on which the multilayer capacitor is to be mounted, and $Lp/Lc > 1.35$, in which $Lc$ is a length of the multilayer capacitor.

According to another aspect of the present disclosure, a multilayer capacitor package includes a first packing part containing first information, and including a first housing and a first multilayer capacitor disposed in the first housing, internal electrodes of the first multilayer capacitor disposed horizontally with respect to a bottom surface of the first housing; and a second packing part containing second information, and including a second housing and a second multilayer capacitor disposed in the second housing, internal electrodes of the second multilayer capacitor disposed vertically with respect to a bottom surface of the second housing. A size of the first multilayer capacitor is substantially the same as a size of the second multilayer capacitor. The first information indicates a first distance Lp1 between outer edges of pads on a board, on which the first multilayer capacitor is to be mounted, and Lp1/Lc≤R0, in which Lc is a length of each of the first and second multilayer capacitors and R0 is a predetermined value. The second information indicates a second distance Lp2 between outer edges of pads on a board, on which the second multilayer capacitor is to be mounted, and Lp2/Lc>R0.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described in detail with reference to the accompanying drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

In the drawings, the shapes and dimensions of elements may be exaggerated for clarity.

Further, in the drawings, elements having the same functions within the same scope of the inventive concept will be designated by the same reference numerals.

Throughout the specification, when a component is referred to as "comprise" or "comprising," it means that it may include other components as well, rather than excluding other components, unless specifically stated otherwise.

A mounting board of a multilayer capacitor according to an embodiment of the present disclosure may include a board having first and second electrode pads on one surface of the board; and a multilayer capacitor.

The multilayer capacitor may include a capacitor body including a dielectric layer and a plurality of internal electrodes stacked with the dielectric layer interposed therebetween; and external electrodes disposed on both end portions of the capacitor body and connected to exposed portions of the internal electrodes.

In this case, when the electronic component satisfies Lp/Lc≤1.35, where a distance between outer edges of the first and second electrode pads is defined as Lp, and a length of the multilayer capacitor is defined as Lc, the dielectric layer and the internal electrodes are horizontally stacked with respect to the board, and when the electronic component satisfies Lp/Lc>1.35, where a distance between outer edges of the first and second electrode pads is defined as Lp, and a length of the multilayer capacitor is defined as Lc, the dielectric layer and the internal electrodes are stacked vertically with respect to the board.

Hereinafter, when defining directions of the capacitor body 110 in order to clearly describe an embodiment of the present disclosure, X, Y, and Z illustrated in the drawings indicates a length direction, a width direction, and a thickness direction of the capacitor body 110, respectively.

Figure 1:
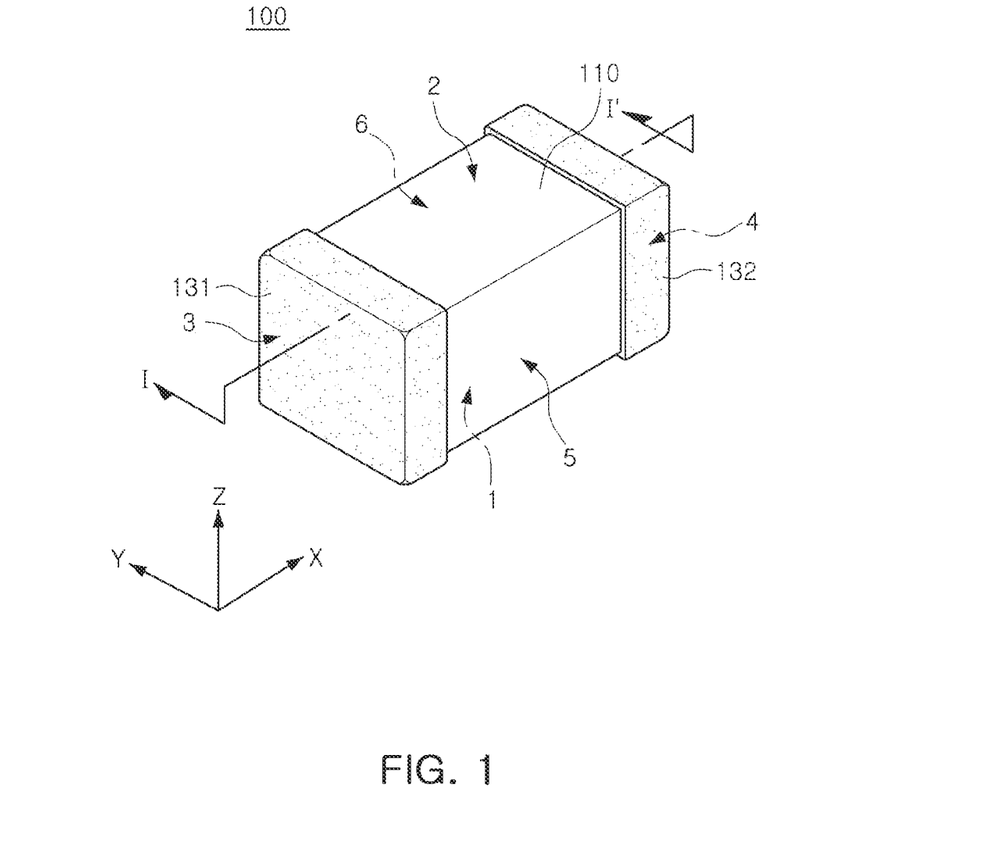
FIG. 1 is a perspective view schematically illustrating a multilayer capacitor according to an embodiment of the present disclosure.
Figure 2A:
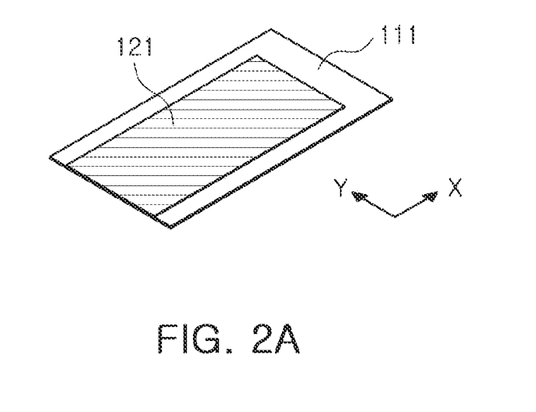
FIGS. 2A and 2B are plan views respectively illustrating first and second internal electrodes applied to the multilayer capacitor of FIG. 1.
Figure 2B:
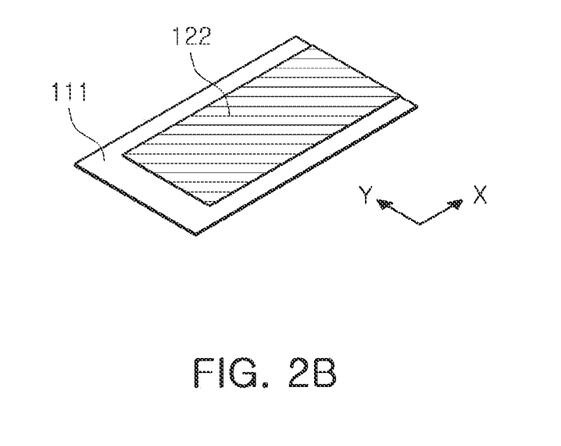
Figure 3:
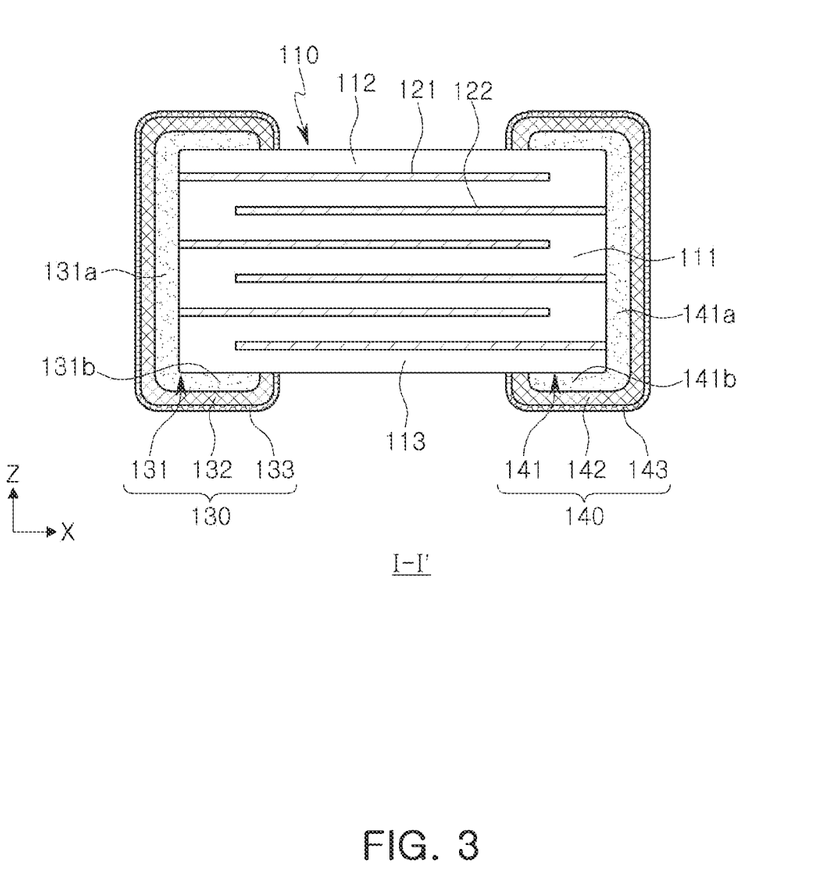
FIG. 3 is a cross-sectional view taken along line I-I' of FIG. 1.

FIG. 1 is a perspective view schematically illustrating a multilayer capacitor according to an embodiment of the present disclosure, FIGS. 2A and 2B are plan views respectively illustrating first and second internal electrodes applied to the multilayer capacitor of FIG. 1, and FIG. 3 is a cross-sectional view taken along line I-I' of FIG. 1.

Referring to FIGS. 1 to 3, a multilayer capacitor 100 according to this embodiment may be a horizontally mounted multilayer capacitor, and may include a capacitor body 110, and first and second external electrodes 130 and 140.

The capacitor body 110 may be obtained by stacking a plurality of dielectric layers 111 in a Z direction and then firing them. A boundary between the dielectric layers 111 adjacent to each other in the capacitor body 110 may be integrated such that it may be difficult to identify the boundary without using a scanning electron microscope (SEM).

At this time, the capacitor body 110 may have a generally hexahedral shape, but the present disclosure is not limited thereto. In addition, a shape and dimensions of the capacitor body 110, and the number of stacked layers of the dielectric layer 111 are not limited to those illustrated in the drawings of this embodiment.

In this embodiment, for convenience of explanation, both surfaces of the capacitor body 110 opposing each other in the Z direction are defined as first and second surfaces 1 and 2, both surfaces connected to the first and second surfaces 1 and 2 and opposing each other in the X direction are defined as third and fourth surfaces 3 and 4, and both surfaces connected to the first and second surfaces 1 and 2, connected to the third and fourth surfaces 3 and 4, and opposing each other in the Y direction are defined as fifth and sixth surfaces 5 and 6. In addition, in this embodiment, a mounting surface of the multilayer capacitor 100 may be the first surface 1 of the capacitor body 110.

The dielectric layer 111 may include a ceramic material having a high dielectric constant, for example, a barium titanate ($BaTiO_3$)-based ceramic powder, a strontium titanate ($SrTiO_3$)-based ceramic powder, or the like, but is not limited thereto, as long as the dielectric layer 111 has sufficient capacitance.

Further, a ceramic additive, an organic solvent, a plasticizer, a binder, a dispersant, and the like may be further added to the dielectric layer 111, together with the ceramic powder.

As the ceramic additive, for example, a transition metal oxide or a transition metal carbide, a rare earth element, magnesium (Mg), aluminum (Al), or the like may be used.

The capacitor body 110 may include an active region serving as a portion contributing to capacitance formation of the capacitor, and upper and lower covers 112 and 113 formed respectively on upper and lower surfaces of the active region in the Z direction as upper and lower margin portions.

The upper and lower covers 112 and 113 may have the same material and configuration as the dielectric layer 111, except that they do not include internal electrodes.

The upper and lower covers 112 and 113 may be formed by stacking a single dielectric layer or two or more dielectric layers on the upper and lower surfaces of the active region in the Z direction, respectively, and may basically serve to prevent first and second internal electrodes 121 and 122 from being damaged by physical or chemical stress.

The first and second internal electrodes 121 and 122 may be electrodes to which different polarities are applied, may be alternately arranged in the Z direction with the dielectric layer 111 interposed therebetween, and may be configured such that one end thereof is exposed through the third and fourth surfaces 3 and 4 of the capacitor body 110, respectively.

In this case, the first and second internal electrodes 121 and 122 may be electrically insulated from each other by the dielectric layer 111 interposed therebetween.

End portions of the first and second internal electrodes 121 and 122 alternately exposed from the third and fourth surfaces 3 and 4 of the capacitor body 110 may be in contact with and may be electrically connected to the first and second external electrodes 130 and 140 arranged on the third and fourth surfaces 3 and 4 of the capacitor body 110, respectively, to be described later.

According to the above configuration, when a predetermined voltage is applied to the first and second external electrodes 130 and 140, electric charges may be accumulated between the first and second internal electrodes 121 and 122.

In this case, capacitance of the multilayered capacitor 100 may be proportional to overlapped area of the first and second internal electrodes 121 and 122, which overlap each other in the active region in the Z direction.

In addition, materials for forming the first and second internal electrodes 121 and 122 are not particularly limited, and may be formed using a noble metal material such as platinum (Pt), palladium (Pd), and palladium-silver (Pd—Ag) alloy, and the like, and a conductive paste made of one or more materials of nickel (Ni) and copper (Cu).

In this case, a method of printing the conductive paste may use a screen-printing method, a gravure printing method, or the like, but the present disclosure is not limited thereto.

The first and second external electrodes 130 and 140 may be provided at voltages of different polarities, may be disposed on both end portions of the capacitor body 110 in the X direction, and may be in contact with and may be electrically connected to each of exposed portions of the first and second internal electrodes 121 and 122, respectively.

In this case, the first and second external electrodes 130 and 140 may include first and second conductive layers 131 and 141 formed on the capacitor body 110 to be connected to the first and second internal electrodes 121 and 122, respectively, first and second inner plating layers 132 and 142 formed to cover the first and second conductive layers 131 and 141, respectively, and first and second outer plating layers 133 and 143 formed to cover the inner plating layer, respectively.

The first and second conductive layers 131 and 141 may include at least one of copper (Cu) and silver (Ag), and may further include a glass, an epoxy, and the like, in addition thereto.

In addition, the first and second inner plating layers 132 and 142 may be nickel plating layers, and the first and second outer plating layers 133 and 143 may be tin plating layers.

The first conductive layer 131 may include a first connection portion 131a and a first bent portion 131b.

The first connection portion 131a may be formed on the third surface 3 of the capacitor body 110, and may be connected to an exposed portion of the first internal electrode 121. The first bent portion 131b may be a portion extending from the first connection portion 131a to a portion of the first surface 1 of the capacitor body 110.

The first bent portion 131b may further extend to a portion of the fifth and sixth surfaces 5 and 6, and a portion of the second surface 2 in the capacitor body 110, to improve fixation strength, and the like.

The second conductive layer 141 may include a second connection portion 141a and a second bent portion 141b.

The second connection portion 141a may be formed on the fourth surface 4 of the capacitor body 110, and may be connected to an exposed portion of the second internal electrode 122. The second bent portion 141b may be a portion extending from the second connection portion 141a to a portion of the first surface 1 of the capacitor body 110.

The second bent portion 141b may further extend to a portion of the fifth and sixth surfaces 5 and 6, and a portion of the second surface 2 in the capacitor body 110, to improve fixation strength, and the like.

Figure 4:
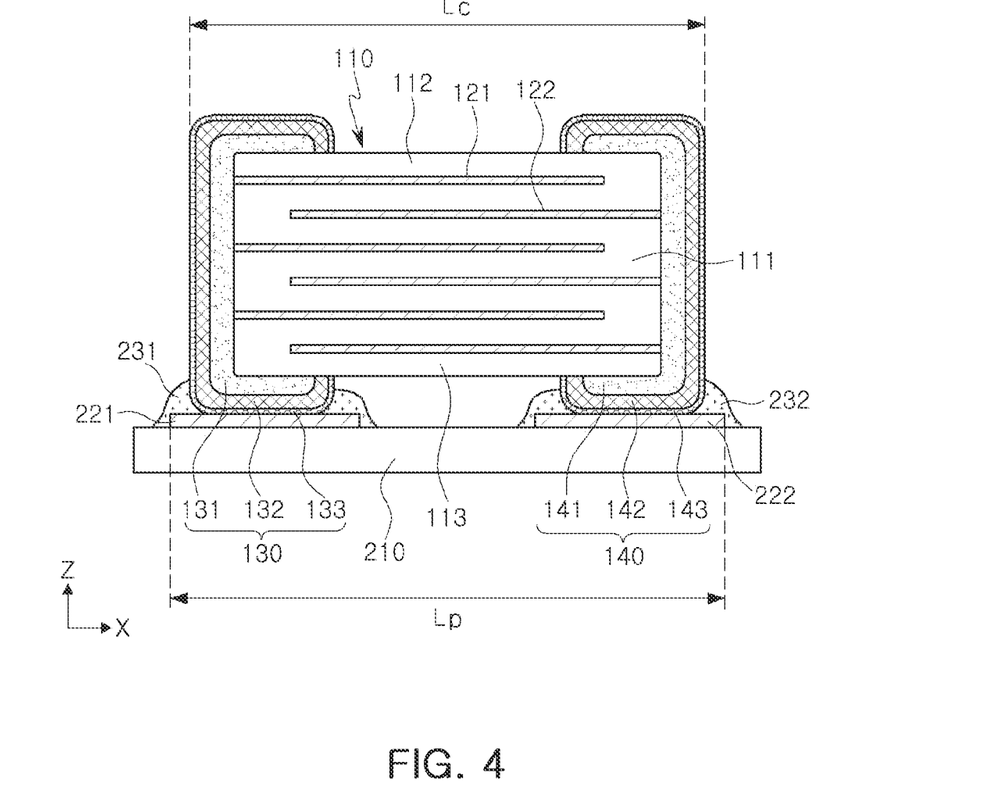
FIG. 4 is a cross-sectional view schematically illustrating a state in which the multilayer capacitor of FIG. 3 is mounted on a board.

FIG. 4 is a cross-sectional view schematically illustrating a state in which the multilayer capacitor of FIG. 3 is mounted on a board.

Referring to FIG. 4, an electronic component according to this embodiment may include a board 210 having first and second electrode pads 221 and 222 on one surface of the board, and a horizontally mounted multilayer capacitor 100 mounted on an upper surface of the board 210 to connect first and second external electrodes 130 and 140 to the first and second electrode pads 221 and 222, respectively.

In this case, first and second internal electrodes 121 and 122 may be stacked in the Z direction with respect to the board 210, and the electronic component satisfies Lp/Lc≤1.35, where a distance between outer edges of the first and second electrode pads 221 and 222 is defined as Lp, and a length of the multilayer capacitor 100 is defined as Lc. In one example, the length Lc of the multilayer capacitor 100 is a dimension of the multilayer capacitor 100 in the X direction. In one example, the first and second electrode pads 221 and 222 having inner edges facing each other in the X direction and the outer edges respectively opposing the inner edges in the X direction.

In addition, in this embodiment, the multilayer capacitor 100 is illustrated and described as being mounted on the board 210 by solders 231 and 232, but a conductive paste may be used instead of a solder, as necessary.

Figure 5A:
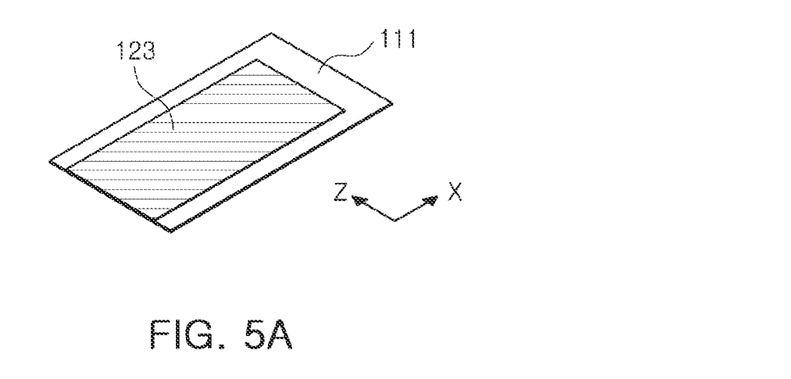
FIGS. 5A and 5B are plan views respectively illustrating third and fourth internal electrodes applied to a multilayer capacitor according to another embodiment of the present disclosure.
Figure 5B:
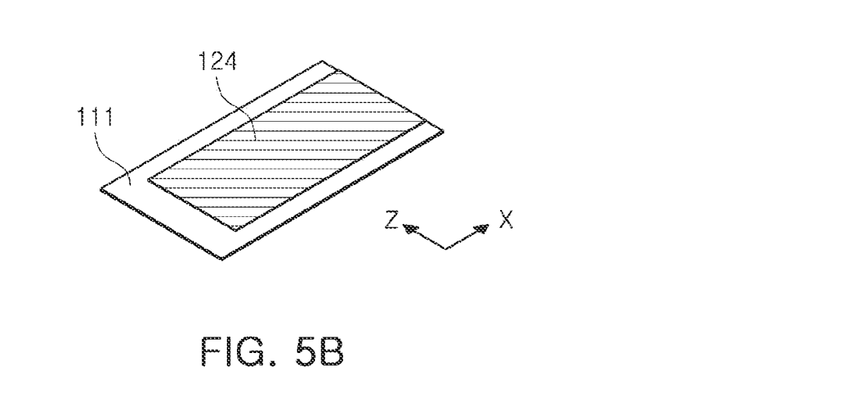
Figure 6:
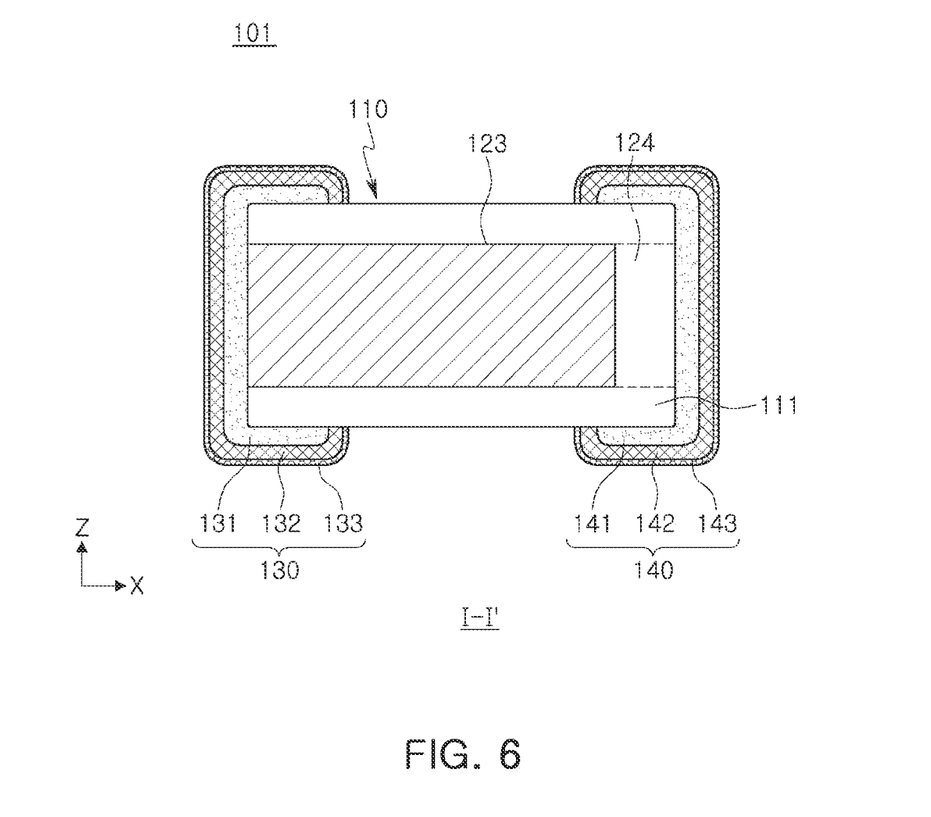
FIG. 6 is a cross-sectional view taken along line I-I' of a multilayer capacitor according to another embodiment of the present disclosure.

FIGS. 5A and 5B are plan views respectively illustrating third and fourth internal electrodes applied to a multilayer capacitor according to another embodiment of the present disclosure, and FIG. 6 is a cross-sectional view taken along line I-I' of a multilayer capacitor according to another embodiment of the present disclosure.

In these cases, since a structure in which first and second external electrodes 130 and 140 are formed may be similar to the above-described embodiment, a detailed description thereof will be omitted in order to avoid duplication. Third and fourth internal electrodes 123 and 124 having a different structure from those of the above-described embodiment will be illustrated and described in detail with reference to the illustrated drawings.

Referring to FIGS. 5A to 6, a multilayer capacitor 101 according to this embodiment may be a vertically mounted multilayer capacitor, in which the third and fourth internal electrodes 123 and 124 may be internal electrodes having different polarities applied thereto, and may be alternately arranged in the Y direction with a dielectric layer 111 interposed therebetween, one end of each of the third and fourth internal electrodes may be exposed from third and fourth surfaces 3 and 4 of a capacitor body 110, respectively.

Figure 7:
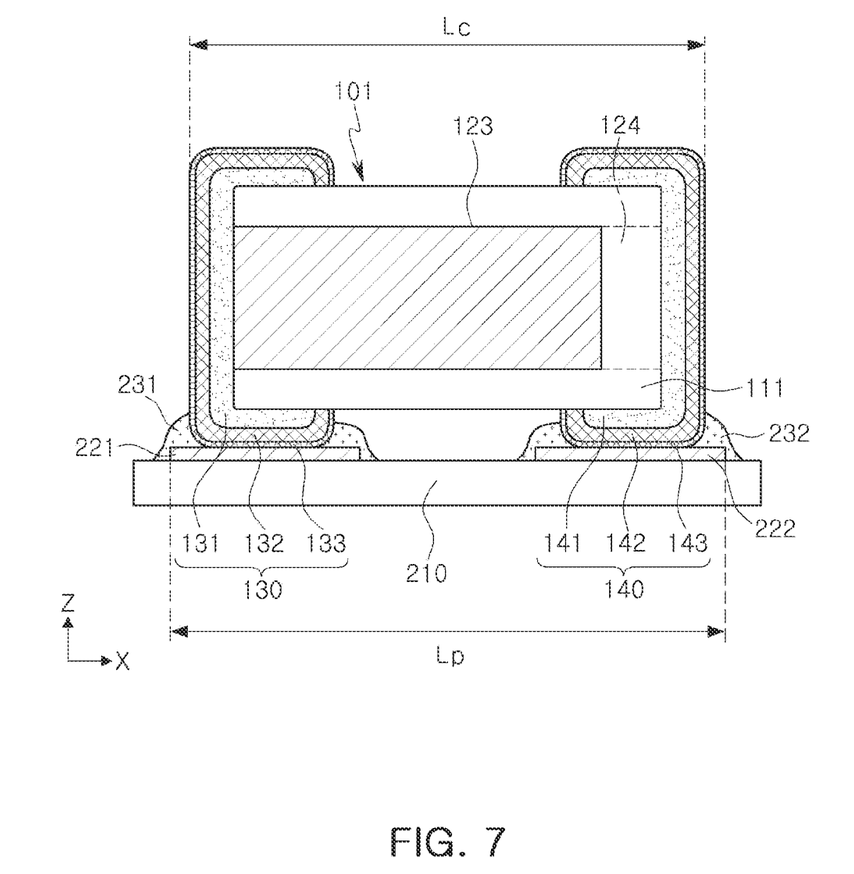
FIG. 7 is a cross-sectional view schematically illustrating a state in which the multilayer capacitor of FIG. 6 is mounted on a board.

FIG. 7 is a cross-sectional view schematically illustrating a state in which the multilayer capacitor of FIG. 6 is mounted on a board.

Referring to FIG. 7, an electronic component according to this embodiment may include a board 210 having first and second electrode pads 221 and 222 on one surface of the board, and a vertically mounted multilayer capacitor 101 mounted on an upper surface of the board 210 to connect first and second external electrodes 130 and 140 to the first and second electrode pads 221 and 222, respectively.

In this case, third and fourth internal electrodes 123 and 124 may be stacked in the Y direction with respect to the board 210, and the electronic component satisfies Lp/Lc>1.35, where a distance between outer edges of the first and second electrode pads 221 and 222 is defined as Lp, and a length of the multilayer capacitor 101 is defined as Lc. In one example, the length Lc of the multilayer capacitor 101 is a dimension of the multilayer capacitor 101 in the X direction. In one example, the first and second electrode pads 221 and 222 having inner edges facing each other in the X direction and the outer edges respectively opposing the inner edges in the X direction.

In addition, in this embodiment, the multilayer capacitor 101 is illustrated and described as being mounted on the board 210 by solders 231 and 232, but a conductive paste may be used instead of a solder, as necessary.

In the case of the present disclosure, it can be seen that the acoustic noise of the vertically mounted products and the horizontally mounted products may be reversed based on Lp/Lc of 1.35, where a distance between outer edges of the first and second electrode pads 221 and 222 is defined as Lp, and a length of the multilayer capacitor 100 is defined as Lc.

Based on the numerical value, the horizontally and vertically mounted products may be usefully utilized, while optimizing the acoustic noise reduction effect, when appropriately selected, as necessary.

In a multilayer capacitor, a magnitude of acoustic noise may vary according to a pad size of a board to be mounted.

In general, as the size of the electrode pad increases, a difference in noise between the horizontally mounted products and the vertically mounted products may decrease, and a board having a pad size greater than a predetermined size may have higher acoustic noise in the horizontally mounted products than the vertically mounted products.

Figure 8:
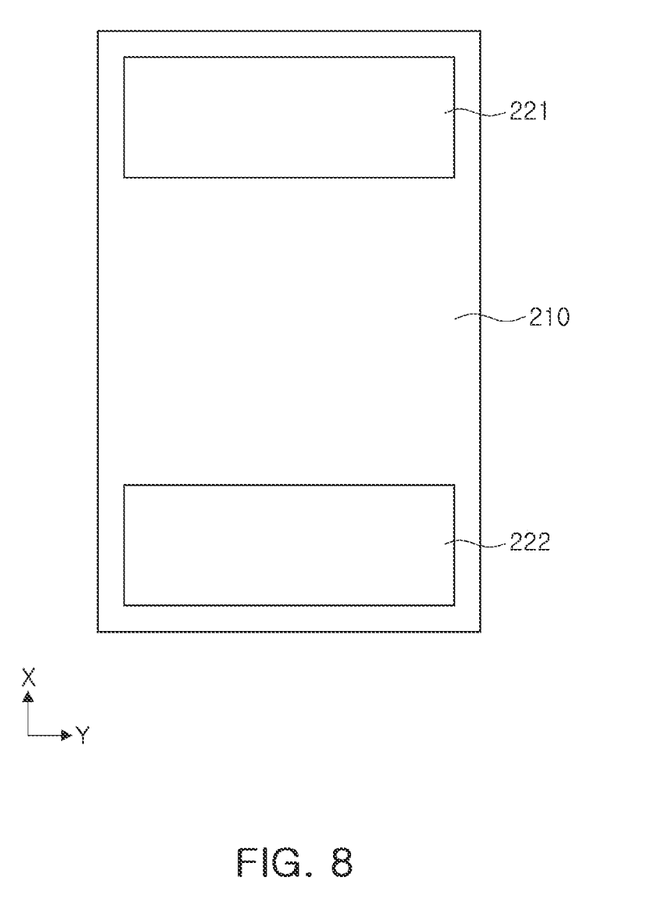
FIG. 8 is a plan view illustrating a board and first and second electrode pads.
Figure 9:
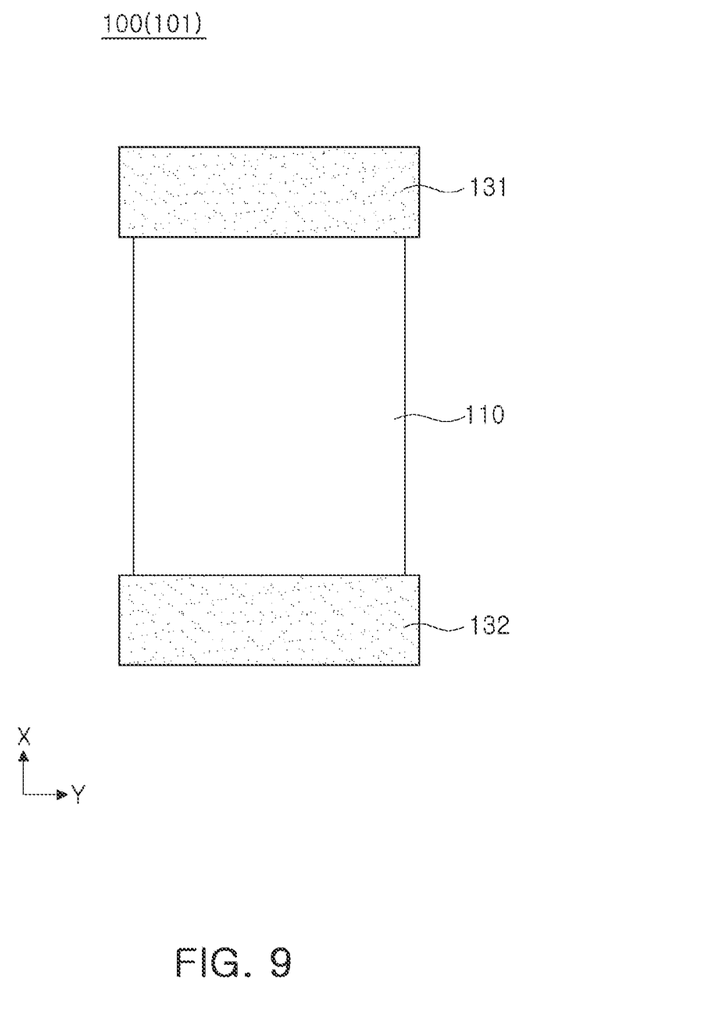
FIG. 9 is a plan view of a multilayer capacitor.
Figure 10:
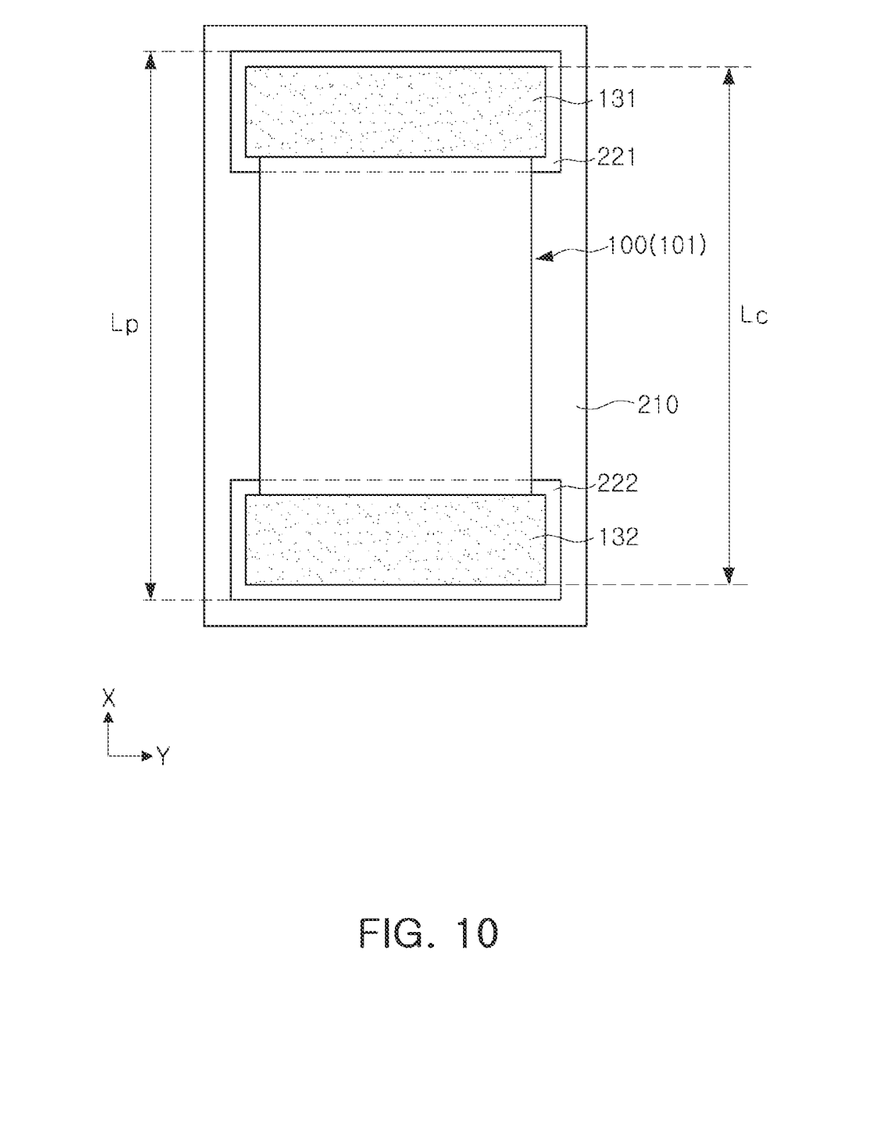
FIG. 10 is a plan view illustrating a multilayer capacitor mounted on a board of FIG. 8.

FIG. 8 is a plan view illustrating a board and first and second electrode pads, FIG. 9 is a plan view of a multilayer capacitor, and FIG. 10 is a plan view illustrating a multilayer capacitor mounted on FIG. 8.

First, a first multilayer capacitor 100, the horizontally mounted multilayer capacitor, and a second multilayer capacitor 101, the vertically mounted multilayer capacitor, may be respectively mounted on a board, and acoustic noise therefor may be measured, respectively. Experiments using multilayer ceramic capacitors MLCCs having a size of 1005 and multilayer ceramic capacitors MLCCs having a size of 1608 were carried out. Table 1 shows acoustic noise test results of the multilayer ceramic capacitors MLCCs.

TABLE 1

| | # | Lp (mm) | Lc (mm) | Lp/Lc | Horizontally mounted (dBA) | Vertically mounted (dBA) |
|---|---|---|---|---|---|---|
| 1005 MLCC | #1 | 1.7 | 1.7 | 1.000 | 23.6 | 28.7 |
| | #2 | 1.96 | 1.7 | 1.153 | 29.6 | 31 |
| | #3 | 2.3 | 1.7 | 1.353 | 34 | 32.9 |
| 1608 MLCC | #4 | 1.21 | 1.2 | 1.008 | 31.9 | 35.1 |
| | #5 | 1.39 | 1.2 | 1.158 | 37.3 | 37.7 |
| | #6 | 1.63 | 1.2 | 1.358 | 40.8 | 38.9 |

Figure 11:
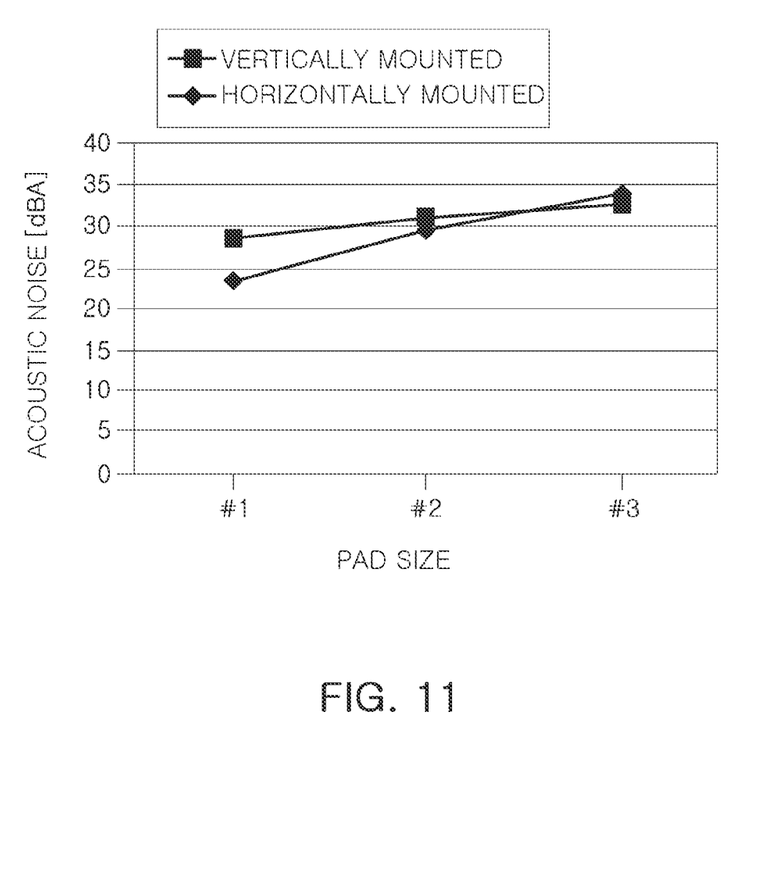
FIGS. 11 and 12 are graphs comparing acoustic noise of a vertically mounted multilayer capacitor and acoustic noise of a horizontally mounted multilayer capacitor, in accordance with sizes of electrode pads.

Referring to Table 1 and FIG. 11, in a case of #1, acoustic noise of an electronic component including a horizontally mounted first multilayer capacitor 100 is illustrated to be relatively low, in a case of #2, acoustic noise of an electronic component including the first multilayer capacitor 100 and acoustic noise of an electronic component including the second multilayer capacitor 101 are illustrated to be approximately similar to each other, and in a case of #3, the acoustic noise of the two are reversed, and acoustic noise of an electronic component including a vertically mounted second multilayer capacitor 101 is illustrated to be relatively low.

In this case, it can be seen that reference value for reversing the acoustic noises of the electronic component including the first and second multilayer capacitors is 1.35.

Figure 12:
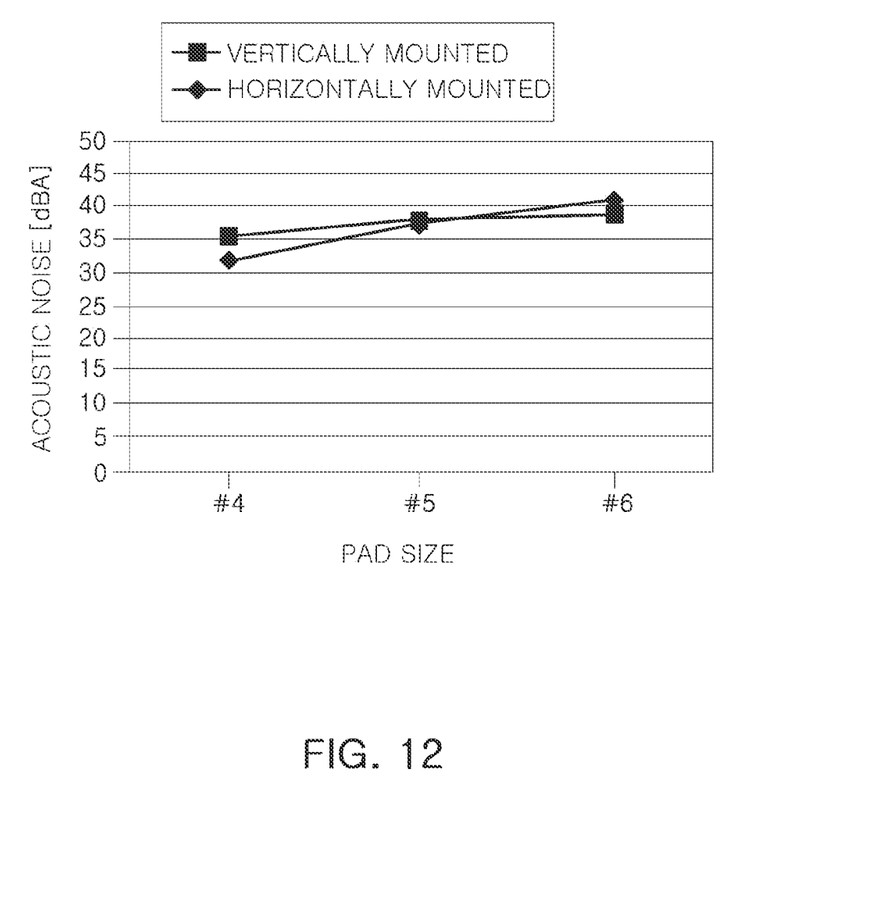

Referring to Table 1 and FIG. 12, in a case of #4, acoustic noise of an electronic component including a horizontally mounted first multilayer capacitor 100 is illustrated to be relatively low, in a case of #5, acoustic noise of an electronic component including the first multilayer capacitor 100 and acoustic noise of an electronic component including the second multilayer capacitor 101 are illustrated to be approximately similar to each other, and in a case of #6, the acoustic noise of the two are reversed, and acoustic noise of an electronic component including a vertically mounted second multilayer capacitor 101 is illustrated to be relatively low.

In this case, it can be seen that reference value for reversing the acoustic noises of the electronic component including the first and second multilayer capacitors is 1.35.

Therefore, according to these experiments, it can be seen that a reference value for reversing the acoustic noises of the horizontally mounted multilayer capacitor and the vertically mounted multilayer capacitor, when the multilayer capacitor is mounted on the board, is 1.35.

Accordingly, in the present disclosure, when the electronic component satisfies Lp/Lc≤1.35, where a distance between outer edges of the first and second electrode pads is defined as Lp, and a length of the multilayer capacitor is defined as Lc, the dielectric layer and the internal electrodes are horizontally stacked with respect to the board, and when the electronic component satisfies Lp/Lc>1.35, where a distance between outer edges of the first and second electrode pads is defined as Lp, and a length of the multilayer capacitor is defined as Lc, the dielectric layer and the internal electrodes are stacked vertically with respect to the board, to optimize the acoustic noise reduction effect.

According to one aspect, a multilayer capacitor may be packaged in a housing of a packing part, such as a reel, in consideration of a value of Lp/Lc, in which Lp is a distance between outer edges of pads on a board, on which the multilayer capacitor is to be mounted and Lc is a length of the multilayer capacitor.

Figure 13:
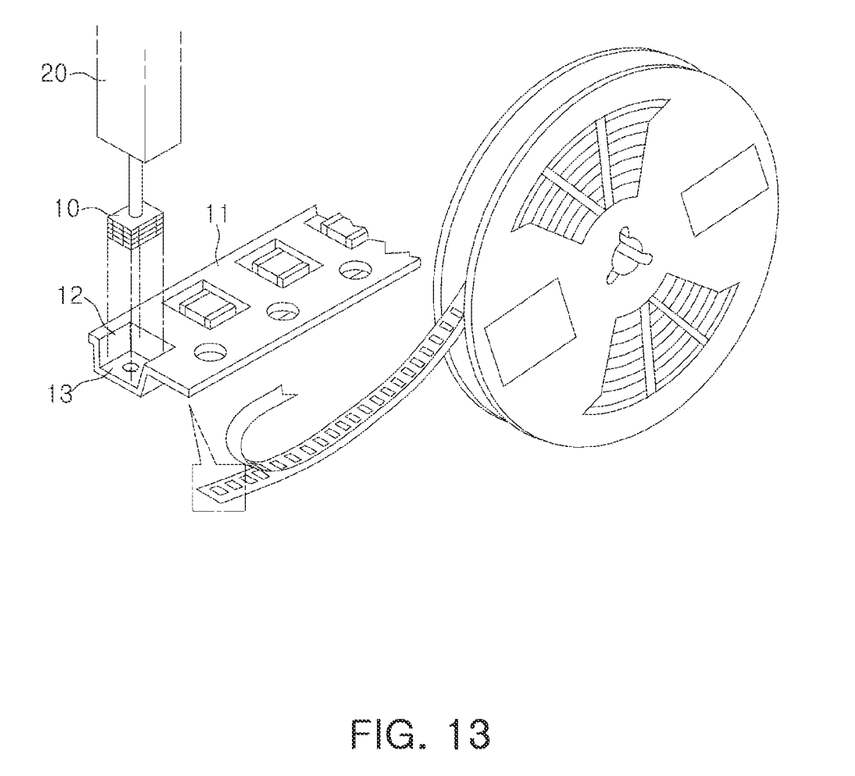
FIG. 13 is a conceptive view showing a method to package a multilayer capacitor.

For example, referring to FIG. 13, after a packaging apparatus 20 receives information about pads, such as the information about the distance Lp between the outer edges of the pads, the packaging apparatus 20 may determine Lp/Lc. The packaging apparatus 20 may dispose a multilayer capacitor 10 in a housing 12 provided by a packing part 11 (e.g., a reel) such that internal electrodes of the multilayer capacitor 10 are disposed horizontally with respect to a bottom surface 13 of the housing 12, in response to a determination that Lp/Lc is greater than the predetermined value, or may dispose the multilayer capacitor 10 in the housing 12 such that the internal electrodes of the multilayer capacitor 10 are disposed vertically with respect to the bottom surface 13 of the housing 12, in response to a determination that Lp/Lc is greater than the predetermined value. As described above, the predetermined value may be 1.35. The packaging apparatus 20 may include a processor and a non-transitory storage storing program, when executed by the processor, to cause the processor to control various other components, such as actuators, of the packaging apparatus 20, so as to perform the above described packaging method. As such, a plurality of multilayer capacitor 10 having substantially the same size in consideration of manufacturing errors, or having the same size, may be packaged.

After packaging the multilayer capacitor 10, information regarding the packaged multilayer capacitor 10 may be provided to the package having the multilayer capacitor 10. For example, a product identification label, name, specification, etc. associated with such information may be disposed on or accompany the package having the multilayer capacitor 10.

In a case in which the internal electrodes of the multilayer capacitor 10 are disposed horizontally with respect to the bottom surface 13 of the housing 12 of the packing part 11, the information may indicate a distance Lp between outer edges of pads on a board, on which the multilayer capacitor 10 is to be mounted. For example, Lp/Lc≤R0, in which Lc is a length of the multilayer capacitor 10 and R0 is a predetermined value. In one example, R0 is equal to 1.35.

In a case in which the internal electrodes of the multilayer capacitor 10 are disposed vertically with respect to the bottom surface 13 of the housing 12 of the packing part 11, the information may indicate a distance Lp between outer edges of pads on a board, on which the multilayer capacitor 10 is to be mounted. For example, Lp/Lc>R0, in which Lc is a length of the multilayer capacitor 10 and R0 is a predetermined value. In one example, R0 is equal to 1.35.

When stacking types of multilayer capacitors are classified and mounted on a board as described above, the acoustic noise reduction effect of electronic components may be optimized. Therefore, when the multilayer capacitors are taped, as necessary, the horizontally mounted multilayer capacitor and the vertically mounted multilayer capacitor may also be considered to be separately taped in advance.

According to an embodiment of the present disclosure, the numerical value in which acoustic noise is reversed according to a direction in which internal electrodes are stacked on a mounting surface in the multilayer capacitor, may be checked to be 1.35, and the multilayer capacitor may be selectively mounted on a board in a direction parallel to or perpendicular to the board on the basis of the checked numerical value, to optimize effects of reducing acoustic noise in the audible frequency region lower than 20 kHz and high frequency vibration of 20 kHz or higher.

While example embodiments have been illustrated and described above, it will be apparent to those skilled in the art that modifications and variations could be made without departing from the scope of the present disclosure as defined by the appended claims.

What is claimed is:

1. A multilayer capacitor package, comprising:
a first packing part having a first label containing first information, and including a first housing and a first multilayer capacitor disposed in the first housing, internal electrodes of the first multilayer capacitor disposed horizontally with respect to a bottom surface of the first housing; and
a second packing part having a second label containing second information, and including a second housing and a second multilayer capacitor disposed in the second housing, internal electrodes of the second multilayer capacitor disposed vertically with respect to a bottom surface of the second housing,
wherein a size of the first multilayer capacitor is substantially the same as a size of the second multilayer capacitor,
the first information indicates a first distance Lp1 between outer edges of pads on a board, on which the first multilayer capacitor is to be mounted,
Lp1/Lc≤1.35, in which Lc is a length of each of the first and second multilayer capacitors,
the second information indicates a second distance Lp2 between outer edges of pads on a board, on which the second multilayer capacitor is to be mounted, and
Lp2/Lc>1.35.

* * * * *